(12) United States Patent  (10) Patent No.: US 9,246,027 B2
Ito et al.  (45) Date of Patent: Jan. 26, 2016

(54) METHOD OF MANUFACTURING SOLAR CELL ELECTRODE

(71) Applicant: E I DU PONT DE NEMOURS AND COMPANY, Wilmington, DE (US)

(72) Inventors: Kazushige Ito, Kawasaki Kanagawa (JP); Jean Yang, Taoyuan (TW)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 89 days.

(21) Appl. No.: 14/280,767

(22) Filed: May 19, 2014

(65) Prior Publication Data

US 2014/0352774 A1 Dec. 4, 2014

Related U.S. Application Data

(63) Continuation-in-part of application No. 13/906,381, filed on May 31, 2013, now abandoned.

(51) Int. Cl.
*H01L 31/0224* (2006.01)
*C03C 8/18* (2006.01)
*H01L 31/068* (2012.01)
*H01B 1/22* (2006.01)

(52) U.S. Cl.
CPC .......... *H01L 31/022425* (2013.01); *C03C 8/18* (2013.01); *H01B 1/22* (2013.01); *H01L 31/068* (2013.01)

(58) Field of Classification Search
None
See application file for complete search history.

(56) References Cited

U.S. PATENT DOCUMENTS

| 7,811,704 | B2 * | 10/2010 | Hall | H01M 4/244 429/213 |
| 2010/0294353 | A1 * | 11/2010 | Takahashi | C09D 5/24 136/256 |
| 2011/0081746 | A1 * | 4/2011 | Nomoto | H01L 51/0011 438/99 |
| 2011/0232746 | A1 * | 9/2011 | Carroll | B22F 1/0059 136/256 |

FOREIGN PATENT DOCUMENTS

JP 2011060519 3/2011

* cited by examiner

*Primary Examiner* — Nathan T Leong

(57) ABSTRACT

A method of manufacturing a solar electrode comprising steps of: (a) stencil printing a conductive paste onto a front side of a semiconductor substrate through a printing mask comprising: (i) 60 wt % to 95 wt % of a conductive powder, (ii) 0.1 wt % to 10 wt % of glass frit, (iii) 3 wt % to 30 wt % of an organic medium, (iv) 0.4 wt % to 1.7 wt % of an amide compound, based on the total weight of the conductive paste and (b) firing the applied conductive paste to form an electrode.

7 Claims, 3 Drawing Sheets

METHOD OF MANUFACTURING SOLAR CELL ELECTRODE

CROSS-REFERENCE TO RELATED APPLICATIONS

This application is a continuation-in-part of application Ser. No. 13/906381, filed May 31, 2013.

FIELD OF THE INVENTION

The invention relates to a solar cell electrode, more specifically to a conductive paste to form a solar cell electrode and a method of manufacturing the solar cell electrode.

TECHNICAL BACKGROUND OF THE INVENTION

Generally, in order to increase the power generation characteristics of the solar cell, the characteristic of the conversion efficiency EFF (%) is particularly important factor among the factors determining the efficiency of a solar cell. In order to achieve this objective, a variety of solar cell manufacturing techniques for fabricating electrodes having a high-aspect ratio have been proposed. For example, a process for forming solar cell electrodes having a high aspect ratio, which attains superior conversion efficiency EFF (%) by screen-printing a conductive paste containing carbon fibers, have been proposed in US-2010-0294353 A1.

SUMMARY OF THE INVENTION

In one aspect, the present invention relates to a method of manufacturing a solar electrode comprising steps of: (a) stencil printing a conductive paste onto a front side of a semiconductor substrate through a printing mask, the conductive paste comprising, (i) 60 wt % to 95 wt % of a conductive powder, (ii) 0.1 wt % to 10 wt % of glass frit, (iii) 3wt % to 30 wt % of an organic medium, (iv) 0.4 wt % to 1.7 wt % of an amide compound, based on the total weight of the conductive paste and (b) firing the applied conductive paste to form an electrode.

In another aspect, the present invention relates to a solar cell electrode manufactured by the method.

The aspect ratio (height/width) of the electrode can be improved by the present invention. Thus, a solar cell with an excellent photoelectric conversion efficiency (efficiency (%)) is efficiently provided according to the present invention.

DETAILED DESCRIPTION OF THE INVENTION

Method of Manufacturing a Solar Electrode

In one embodiment, the method of manufacturing a solar electrodes comprise steps of (a) stencil printing a conductive paste onto a front side of a semiconductor substrate through a printing mask and (b) firing the applied conductive paste to form an electrode.

The following shows an embodiment of the manufacturing process of solar cells, where the substrate is a p-type silicon wafer. However, the invention is not limited to the following embodiment.

Figure 1A:
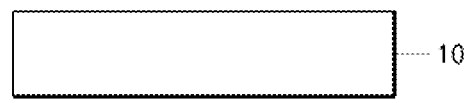
FIG. 1A to 1F explain the method of manufacturing a solar cell.
Figure 1B:
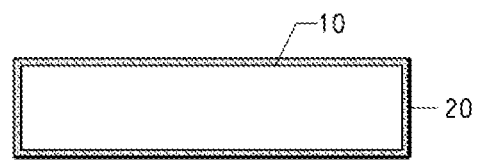

FIG. 1A shows a silicon wafer of p-type base layer 10. In FIG. 1B, an n-type emitter 20, of the reverse conductivity type is formed by the thermal diffusion of phosphorus (P). Phosphorus oxychloride ($POCl_3$) is commonly used as the phosphorus diffusion source. In the absence of any particular modification, the n-type emitter 20 is formed over the entire surface of the p-type base layer 10.

Figure 1C:
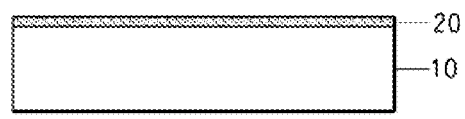

After protecting one surface of the n-type emitter 20 with a resist, the n-type emitter 20 is removed from most surfaces by etching so that it remains only on one main surface as illustrated in FIG. 1C. The resist is then removed using an organic solvent. The semiconductor substrate containing at least the p-type base layer 10 and the n-type emitter 20 can be obtained here. The reverse type of semiconductor substrate that has an n-type base layer and a p-type emitter can be available as well.

Figure 1D:
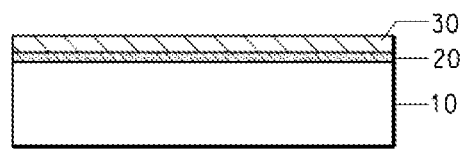

A passivation layer 30 can be formed on the n-type emitter 20 in an embodiment as illustrate in FIG. 1D by a process such as plasma chemical vapor deposition (CVD). Silicon nitride, titanium, alumina, silicon oxide or Indium titan oxide could be used as a material for the passivation layer 30. Most commonly used is silicon nitride. The passivation layer 30 is sometimes called "anti-reflection layer", especially when it is formed on the light receiving side of the solar cell. The semiconductor substrate further contains the passivation layer 30 on the n-type emitter 20 in an embodiment.

Figure 1E:
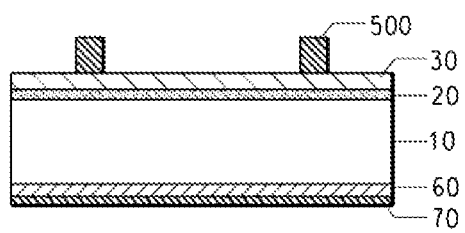

As shown in FIG. 1E, a first conductive paste 500 having specific chemical composition is applied by stencil printing on the passivation layer 30 for forming front electrodes and then dried. The drying temperature can be 50 to 200° C. The applied pattern by stencil printing on the front side can comprise a fine line with high aspect ratio so that the front side can receive more sunlight. The front electrodes of the fine line are often called a finger line or a bus bar.

The semiconductor substrate is turned over to form another electrode at the back side, for example, by screen printing a second conductive paste 60 onto the p-type base layer 10 and successively dried. The second conductive paste 60, usually contains aluminum (Al) powder. It is not essential, however, a third conductive paste 70, usually containing silver powder can be partially applied onto the second conductive paste 60, to form a tab electrode to solder.

Firing can be carried out in a furnace. After firing the pattern of the conductive pastes, they firmly adhere to the substrate by melting the organic binder or inorganic binder. In an embodiment, the conductive paste can be firing type. In this case, the conductive paste can be fired at the peak temperature of 450 to 1000° C. for 1 second to 10 minutes in an embodiment, 600 to 900° C. for 1 second to 3 minutes in another embodiment. Total firing time can be 10 seconds to 30 minutes in an embodiment, 20 seconds to 15 minutes in another embodiment, 30 seconds to 5 minutes in still another embodiment. When firing under such conditions, the electrodes can be formed with less damage to the semiconductor substrate. The firing time can be counted, for example, from entrance to exit of the furnace.

Figure 1F:
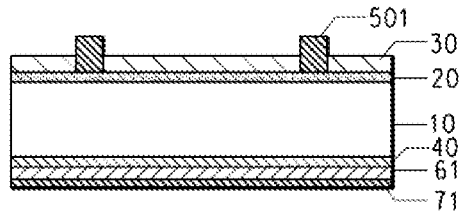

As shown in FIG. 1F, during the firing, Al diffuses as an impurity from the second conductive paste 60, containing Al powder into the p-type base layer 10, on the back side, thereby forming a back surface field (BSF) 40. Firing converts the first conductive paste 500 to the front-side electrode 501, the second conductive paste 60 to the backside electrode 61, and the third conductive paste 70 to a tab electrode 71.

During the heating, the boundary between the backside electrode 61, and the tab electrode 71, assumes the state of an alloy, thereby achieving the electrical connection between the electrodes.

On the front side, the front electrode 501 is made of the front-side conductive paste 500, which is capable of firing through the passivation layer 30, to achieve the electrical contact with the n-type emitter 20, during the firing.

In particular, because the front-side electrode 501 is formed by applying a conductive paste 500 having a specific chemical composition by way of stencil printing onto the front side of a semiconductor substrate, the obtained electrode 501 has a high-aspect ratio (height/width). The p-type base solar cell is explained above as an example. The invention can be available in any type of solar cells such as n-type base solar cell or back contact type of solar cell. The present invention is described in more detail below.

Step (a): Stencil Printing

Conductive Paste for Stencil Printing

The conductive paste is explained in detail below. The conductive paste contains (i) a conductive powder, (ii) a glass frit, (iii) an organic medium and (iv) an amide compound.

(i) Conductive Powder

The conductive powder is any powder that enables to transport electrical current. The conductive powder is a metal powder selected from the group consisting of iron (Fe), aluminum (Al), nickel (Ni), copper (Cu), silver (Ag), gold (Au), palladium (Pd) and a mixture thereof in an embodiment. The conductive powder can comprise Ag powder, Al powder or a mixture thereof in another embodiment. Using such conductive metal powders with high electrical conductivity, electrical property of the electrode could be improved.

The conductive power to form the front-side electrode comprises at least Ag powder, in an embodiment, as in the explanation above. In an embodiment, the conductive powder can be flaky, nodular or spherical in shape. The particle diameter of the conductive powder can be 0.01 µm to 10 µm in an embodiment, 0.5 to 8 µm in another embodiment, and 1 to 5 µm in another embodiment. The conductive powder with such particle diameter can be adequately dispersed in the organic binder and solvent, and smoothly applied by stencil printing.

The particle diameter is obtained by measuring the distribution of the particle diameters by using a laser diffraction scattering method. The median which is 50th percentile of the particle size distribution as measured by volume is defined as D50 to represent the particle diameter. Microtrac model X-100 is an example of the commercially-available devices that can be used for this measurement.

In one embodiment, the amount of conductive powder in the conductive paste is 60 to 95 wt %, 65 to 92 wt % in another embodiment, 70 to 90 wt % in further embodiment, based on the total weight of the conductive paste, in view of conductivity. So long as the amount thereof is 60 wt % or more based on the whole conductive paste, it is unlikely that, when the paste is printed to form a line, the line width expands due to sagging, etc. Meanwhile, so long as the amount thereof is 95 wt % or less based on the whole conductive paste, the paste has a proper value of viscosity and hence has excellent printability. Consequently, so long as the amount thereof is in the numeral-value range of 60 to 95 wt %, a conductive paste which is capable of forming, with satisfactory printability, an electrode pattern with a small line width can be obtained.

The conductive powder can be coated or not coated with organic materials such as a surfactant. In an embodiment, the conductive powder can be coated with a surfactant, particularly when the conductive powder is too finely divided to disperse well in the organic medium.

(ii) Glass Frit

The conductive paste comprises a glass frit. The glass frit is added so that the glass frit melts and adheres to the substrate at the relatively high temperature during the firing step. The chemical composition of the glass frit here is not limited. Any glass frits suitable for use in electrically conducting pastes for electronic devises are acceptable. For example, a lead-tellurium-boron-oxide composition, a lead borosilicate composition, or a lead-free bismuth composition can be used. The lead-tellurium-boron-oxide (Pb—Te—B—O) composition may be crystalline, partially crystalline, amorphous, partially amorphous, or combinations thereof. In an embodiment, the Pb—Te—B—O composition may include more than one glass composition. In an embodiment, the Pb—Te—B—O composition may include a glass composition and an additional composition, such as a crystalline composition. The terms "glass" or "glass composition" will be used herein to represent any of the above combinations of amorphous and crystalline materials.

In an embodiment, the glass compositions may also include additional components such as silicon, silver, tin, bismuth, aluminum, titanium, copper, lithium, cerium, zirconium, sodium, vanadium, zinc, fluorine.

The lead-tellurium-boron-oxide (Pb—Te—B—O) may be prepared by mixing PbO, $TeO_2$, and $B_2O_3$ (or other materials that decompose into the desired oxides when heated) using techniques understood by one of ordinary skill in the art. Such preparation techniques may involve heating the mixture in air or an oxygen-containing atmosphere to form a melt, quenching the melt, and grinding, milling, and/or screening the quenched material to provide a powder with the desired particle size. Melting the mixture of lead, tellurium, and boron oxides is typically conducted to a peak temperature of 800 to 1200° C. The molten mixture can be quenched, for example, on a stainless steel platen or between counter-rotating stainless steel rollers to form a platelet. The resulting platelet can be milled to form a powder. Typically, the milled powder has a D50 of 0.1 to 3.0 µm. One skilled in the art of producing glass frit may employ alternative synthesis techniques such as but not limited to water quenching, sol-gel, spray pyrolysis, quenching by splat cooling on a metal platen, or others appropriate for making powder forms of glass.

In an embodiment, the starting mixture used to make the Pb—Te—B—O may include (based on the weight of the total starting mixture): PbO that may be 25 to 75 wt %, 30 to 60 wt %, or 30 to 50 wt %; $TeO_2$ that may be 10 to 70 wt %, 25 to 60 wt %, or 40 to 60 wt %; $B_2O_3$ that may be 0.1 to 15 wt %, 0.25 to 5 wt %, or 0.4 to 2 wt %. In an embodiment, PbO, $TeO_2$, and $B_2O_3$ may be 80-100 wt % of the Pb—Te—B—O composition. In a further embodiment, PbO, $TeO_2$, and $B_2O_3$ may be 85-100 wt % or 90-100 wt % of the Pb—Te—B—O composition.

In one embodiment, the amount of the glass frit is 0.1 to 10 wt %, in another embodiment 0.5 to 8 wt %, in another embodiment 1 to 5 wt %, based on the total weight of the conductive paste. With such amount of the glass frit, sintering a conductive powder and adhesion between an electrode and a substrate can become sufficient. In one embodiment, the softening point of the glass frit can be 390 to 600° C. When the softening point is in the range, the glass frit could melt properly to obtain the effects mentioned above.

(iii) Organic Medium

The conductive paste comprises an organic medium, which comprises organic binder and solvent.

In an embodiment, the organic binder can comprise ethyl cellulose, ethylhydroxyethyl cellulose, wood rosin, phenolic resin, acryl resin, polymethacrylate of lower alcohol, or monobutyl ether of ethylene glycol monoacetate, diethylene glycol monobutyl ether, diethylene glycol monobutyl ether acetate or a mixture thereof.

In an embodiment, the solvent can comprise terpenes such as alpha- or beta-terpineol or mixtures thereof, texanol, kerosene, dibutylphthalate, butyl carbitol, butyl carbitol acetate, hexylene glycol, bis(2-(2-butoxyethoxy)ethyl)adipate, dibasic esters such as DBE, DBE-2, DBE-3, DBE-4, DBE-5, DBE-6, DBE-9, and DBE 1 B, octyl epoxy tallate, isotetradecanol, and pentaerythritol ester of hydrogenated rosin.

The amount of organic medium is 3 to 30 wt % in an embodiment, 5 to 25 wt % in another embodiment, 7 to 23 wt % in further embodiment, based on the total weight of the conductive paste.

(iv) Amide Compound

In one embodiment, by stencil printing a conductive paste to which an amide compound is added in a given amount on a substrate through a given metal mask, an electrode which has a high aspect ratio, has excellent fineness, and attains a high light conversion efficiency can be formed on the front-side substrate of a solar cell. In another embodiment, the amide compound incorporated into the paste functions as a thixotrope which adequately improves and adjusts the viscosity of the paste.

The amide compound is a compound with the functional group $R_1CON R'_2$ (R and R' refer to H or organic groups).

As the amide compound, a fatty acid amide is especially preferred from the standpoint that the addition thereof even in a small amount can impart high viscosity to the paste. The fatty acid amide is defined as an amide formed from a fatty acid(s) and an amine(s).

The fatty acid amide is available as a commercial product in the form of a powder or paste. In an embodiment, use of a powdery fatty acid amide is used from the standpoint of convenience. The fatty acid amide powder is prepared by particle-size reduction with, for example, a dry-process pulverizer such as a jet mill. The particle diameter (D50) thereof can be 20 μm or smaller in one embodiment, 10 μm or smaller in another embodiment.

In one embodiment, the fatty acid amide is a fatty acid diamide represented by the formula, R'—CO—NH—R"—NH—CO—R'. The diamide is obtained by reacting a diamine with hydroxylated fatty acids in an embodiment.

R' independently represent an aliphatic chain of a fatty acid (fatty acid without a carboxyl group). The aliphatic chain can be substituted with one or more groups such as hydroxyl group.

The aliphatic chain includes 4-28 carbon atoms in an embodiment. The fatty acids used for the fatty acid amide include the following acid in an embodiment.

Myristoleic acid ($CH_3(CH_2)_3CH=CH(CH_2)_7COOH$)
Palmitoleic acid ($CH_3(CH_2)_5CH=CH(CH_2)_7COOH$)
Sapienic acid ($CH_3(CH_2)_8CH=CH(CH_2)_4COOH$)
Oleic acid ($CH_3(CH_2)_7CH=CH(CH_2)_7COOH$)
Elaidic acid ($CH_3(CH_2)_7CH=CH(CH_2)_7COOH$)
Vaccenic acid ($CH_3(CH_2)_5CH=CH(CH_2)_9COOH$)
Linoleic acid ($CH_3(CH_2)_4CH=CHCH_2CH=CH(CH_2)_7COOH$)
Linoelaidic acid ($CH_3(CH_2)_4CH=CHCH_2CH=CH(CH_2)_7COOH$)
α-Linolenic acid ($CH_3CH_2CH=CHCH_2CH=CHCH_2CH=CH(CH_2)_7COOH$)
Arachidonic acid ($CH_3(CH_2)_4CH=CHCH_2CH=CHCH_2CH=CHCH_2CH=CH(CH_2)_3COOH$)
Eicosapentaenoic acid ($CH_3CH_2CH=CHCH_2CH=CHCH_2CH=CHCH_2CH=CHCH_2CH=CH(CH_2)_3COOH$)
Erucic acid ($CH_3(CH_2)_7CH=CH(CH_2)_{11}COOH$)
Docosahexaenoic acid ($CH_3CH_2CH=CHCH_2CH=CHCH_2CH=CHCH_2CH=CHCH_2CH=CHCH_2CH=CH(CH_2)_2COOH$)
Caprylic acid ($CH_3(CH_2)_6COOH$)
Capric acid ($CH_3(CH_2)_8COOH$)
Lauric acid ($CH_3(CH_2)_{10}COOH$)
Myristic acid ($CH_3(CH_2)_{12}COOH$)
Palmitic acid ($CH_3(CH_2)_{14}COOH$)
Stearic acid ($CH_3(CH_2)_{16}COOH$)
Arachidic acid ($CH_3(CH_2)_{18}COOH$)
Behenic acid ($CH_3(CH_2)_{20}COOH$)
Lignoceric acid ($CH_3(CH_2)_{22}COOH$)
Cerotic acid ($CH_3(CH_2)_{24}COOH$)

The fatty acids used for the fatty acid amide is capric acid, stearic acid, hydroxy capric acid or hydroxy stearic acid in an embodiment. In these cases, R' in the above formula is $CH_3(CH_2)_8$, $CH_3(CH_2)_{16}$, $CH_3(CHOH)(CH_2)_7$, or $CH_3(CHOH)(CH_2)_{15}$. The place of CHOH can be anywhere in the chain.

R" represents an alkylene group of a diamine (alkylene group without two amino groups). The alkylene part can be substituted with one or more groups.

The alkylene group includes 2-6 carbon atoms in an embodiment. The diamines used for the fatty acid amide include the following amines in an embodiment.

Ethylenediamine (1,2-diaminoethane)
1,3-Diaminopropane (propane-1,3-diamine)
Putrescine (butane-1,4-diamine)
Cadaverine (pentane-1,5-diamine)
Hexamethylenediamine (hexane-1,6-diamine)
1,2-Diaminopropane
Diphenylethylenediamine
Diaminocyclohexane
o-Xylylenediamine
m-Xylylenediamine
p-Xylylenediamine
o-Phenylenediamine
m-Phenylenediamine
p-Phenylenediamine
4,4'-Diaminobiphenyl
1,8-Diaminonaphthalene The diamines used for the fatty acid amide is ethylenediamine in an embodiment. In this case, R" in the above formula is CH2CH2.

In one embodiment, the fatty acid amide is a diamide having a general structure represented by the following formula (A).

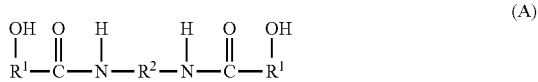

(A)

In formula (A), $R^1$ represents the residue formed by removing the carboxyl group from the hydroxylated fatty acid. $R^2$ represents the to residue formed by removing the amino groups from the diamine. In one embodiment, a fatty acid amide represented by formula (A) where either of the $R^1$s located at both ends does not have the hydroxy group bonded thereto is used.

In another embodiment, examples of the fatty acid amide include a fatty acid amide having a general structure represented by the following formula (B).

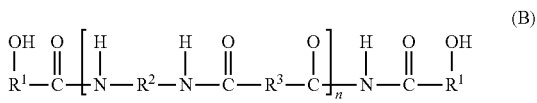

The amide compound represented by formula (B) is obtained by reacting a basic carboxylic acid, a diamine, and a hydroxylated fatty acid. In formula (B), $R^1$ and $R^2$ are the same as the $R^1$ and $R^2$ in formula (A). $R^3$ represents a residue formed by removing carboxyl groups from the basic carboxylic acid. In one embodiment, the average degree of polymerization (n) of the amide compound represented by formula (B) is 3 to 5, and the number-average molecular weight (Mn) thereof is 1,000 to 2,000. These fatty acid amides may be used alone or in combination of two or more thereof.

The amount of the amide compound is 0.4 to 1.7 weight percent wt % in an embodiment, 0.6 to 1.4 wt % in another embodiment, 0.7 to 1.0 wt % in further embodiment, based on the total weight of the conductive paste.

Due to the amount of the amide compound in the aforementioned numerical-value range, a conductive paste is provided from which an electrode having a high aspect ratio and excellent fineness and attaining a high light conversion efficiency can be formed on the front-side substrate of a solar cell by stencil printing the paste on the substrate through a given metal mask.

(v) Other Additives

As additives in one embodiment, thickeners, stabilizers or emulsifiers, or viscosity modifiers (other than aforementioned amide compound) can be added to the conductive paste. Multiple types of additives can be used. Type and amount of the additives can be chosen by people in the industry, in view of desired characteristics such as preservation stability, printability, or resulting electrical property.

(vi) Physical Properties of Conductive Paste

Viscosity

The viscosity of the conductive paste is 350-1000 Pa·s, in an embodiment, 500-950 Pa·s in another embodiment, 550-940 in further embodiment. So long as the viscosity thereof is 350 Pa·s or higher, there are few cases where, when the conductive paste is printed to form a line, the line width expands due to sagging, the height of the formed electrode is insufficient, or other trouble arises. Meanwhile, so long as the viscosity thereof is 1,000 Pa·s or less, the conductive paste has a proper value of viscosity and hence has excellent printability.

In the present invention, the viscosity of the conductive paste is a value obtained by measurement at 25° C., 10 rpm using a Brookfield HBT viscometer with a #14 spindle and a utility cup.

Inorganic Solids

The inorganic solids content of the conductive paste is calculated as the percentage (wt %) of inorganic solids relative to the total weight of the conductive paste. The inorganic solids typically consist of conductive powders and glass frit. In one embodiment, the inorganic solids content is 60.1 to 95.5 wt %. In another embodiment, it is 85 to 93 wt %.

So long as the inorganic solids content is 60.1 wt % or more based on the whole conductive paste, it is unlikely that, when the paste is printed to form a line, the line width expands due to sagging, etc. Meanwhile, so long as the content thereof is 95.5 wt % or less based on the whole conductive paste, the paste has a proper value of viscosity to have excellent printability. Consequently, so long as the inorganic solids content is in the numeral-value range of 60.1 to 95.5 wt %, a conductive paste capable of forming, with satisfactory printability, an electrode pattern with a small line width can be obtained.

In cases where the inorganic solids content is lower than 60.1 wt %, there are cases where, when the conductive paste is printed to form a line, line width expansion or an insufficient line height results due to sagging. Meanwhile, in cases where the inorganic solids content exceeds 95.5 wt %, there are cases where printing becomes difficult because, for example, this conductive paste has so high viscosity that the paste causes mask clogging, etc.

(vii) Stencil Printing

In one embodiment, in the stencil printing method, a metal mask having at least one opening is used. The shape of the opening may be tapered, that is, a tapered shape in which, when the mask is placed on a substrate, the width of the opening becomes gradually smaller from the paste-filling side (upper part) of the mask to the substrate-contact side (lower part), or may be a non-tapered shape in which the upper part of the opening has the same diameter as the lower part of the opening.

The thickness and width of the metal mask are suitably designed so that the formed electrode has desired fineness and a desired aspect ratio, on the basis of the diameter of the silver particles contained in the paste, the content, the viscosity, etc. The thickness can be from about 0.003 mm to about 0.2 mm, and the width of the opening can be from about 10 μm to 200 μm, in one embodiment. The metal mask may be, for example, a foil made of a metal such as nickel or stainless steel.

In the stencil printing method, a mask having the opening is placed on a substrate, and the conductive paste is applied thereto from above. During the application, a squeeze or a feed supply head may be used, or the step of forcing the paste out from the opening of the mask to the substrate may be involved.

Step (b): Firing

The firing condition is for about 1 to 15 minutes at a temperature of about 600 to 900° C. (peak temperature) in a typical infrared firing furnace in an embodiment. A solar cell electrode with a high aspect ratio can be used by using the aforementioned conductive paste.

A Solar Cell Electrode

As explained above, the solar cell electrode can be formed efficiently as an electrode with a high aspect ratio and a small line width (fine line). The line width of the electrode is 10 to 100 μm in an embodiment, 20 to 60 μm in another embodiment. The height of the electrode is 10 to 60 μm in an embodiment, 10 to 35 μm in another embodiment. An aspect ratio (height/width) is 0.3 to 0.6 in one embodiment, 0.4 to 0.6 in another embodiment. Incidentally, "aspect ratio" means the value of width/height of the formed electrode, and specific measurement and calculation methods are shown in the Examples given below.

EXAMPLES

The present invention is illustrated by, but is not limited to, the following examples.

(Conductive Paste Preparation)

A conductive paste was prepared with the following procedure. An organic binder (polymer) and an organic solvent were mixed in a glass vial for 48 hours at 100° C. to form an organic medium. Ag powder and an amide compound were added to the organic medium and mixed further for 5 minutes by a planetary centrifugal mixer to form a conductive paste.

The used materials in the conductive paste are shown below.

Ag Powder: Spherical Ag powder with particle diameter (D50) of 2.0 μm

Glass Frit: Lead-Tellurium-Boron-Oxide Composition (The composition comprises 30 to 50 wt % of PbO, 45 to 60 wt % of $TeO_2$, 5-8 wt % of $Bi_2O_3$, 0.25-2 wt % of $Li_2O$, and 0.25-2 wt % of $B_2O_3$).

Organic medium: a mixture of 10 wt % binder and 90 wt % solvent (binder: ethyl cellulose, solvent: texanol (6 wt %), butyl carbitol acetate (73 wt %), and butyl carbitol (11 wt %))

Amide compound: Fatty acid amide (DISPARLON® 6500 from Kusumoto Chemicals, Ltd.)

When well mixed, the conductive paste was repeatedly passed through a 3-roll mill for at progressively increasing pressures from 0 to 400 psi. and the gap of the rolls was adjusted to 1 mil. The degree of dispersion was measured by fineness of grind (FOG). A typical FOG value was generally equal to or less than 20/10 for a conductor.

(Forming a Solar Cell Electrode)

The conductive paste was stencil printed on a silicon substrate (156 mm×156 mm) through a nickel mask (manufactured by Newlong, LS-25TV). The mask had a pattern of 10 μm width, 50 mm length and 40 μm thickness. The silicon substrate had a passivation layer ($SiN_x$) on the front side surface of the substrate. The conductive paste was applied onto the passivation layer.

On the back side of the substrate, an electrically conductive paste was coated for solder connection by screen printing and dried. The electrically conductive paste contained silver particles, glass particles and a resin binder. The drying temperature of the pastes was 150° C. The resulting substrate was subjected to simultaneous firing of the coated pastes in an infrared furnace with a peak temperature of 750° C. and IN-OUT for about 5 min to obtain the desired test sample solar cell electrode.

(Test Procedure-Aspect Ratio and Efficiency (%))

The width and height of the formed electrode was measured by Laser tech OPTELICS 130C. Aspect ratio was calculated as "Width/Height" with the measured width and height of the formed electrode.

The solar cell electrodes built above was tested for efficiency (Eff (%)) with a commercial IV tester (ST-1000). Xenon (Xe) arc lamp in the IV tester simulated the sunlight with 940 w/m$^2$ intensity and radiated over the formed electrode on the front surface of the cell. The tester used a four contact method to measure current (I) and voltage (V) at approximately 400 load resistance settings to determine the cell's I-V curve. Eff (%) was calculated from the I-V curve.

(Results)

Figure 2:
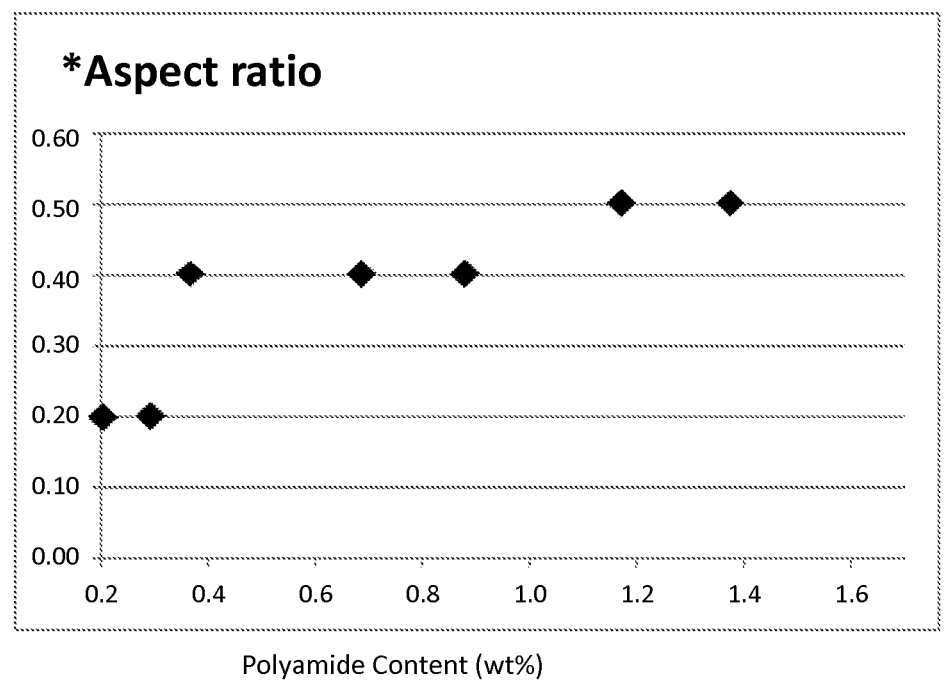
FIG. 2 shows the results of a measurement of Aspect ratio in the Examples.
Figure 3:
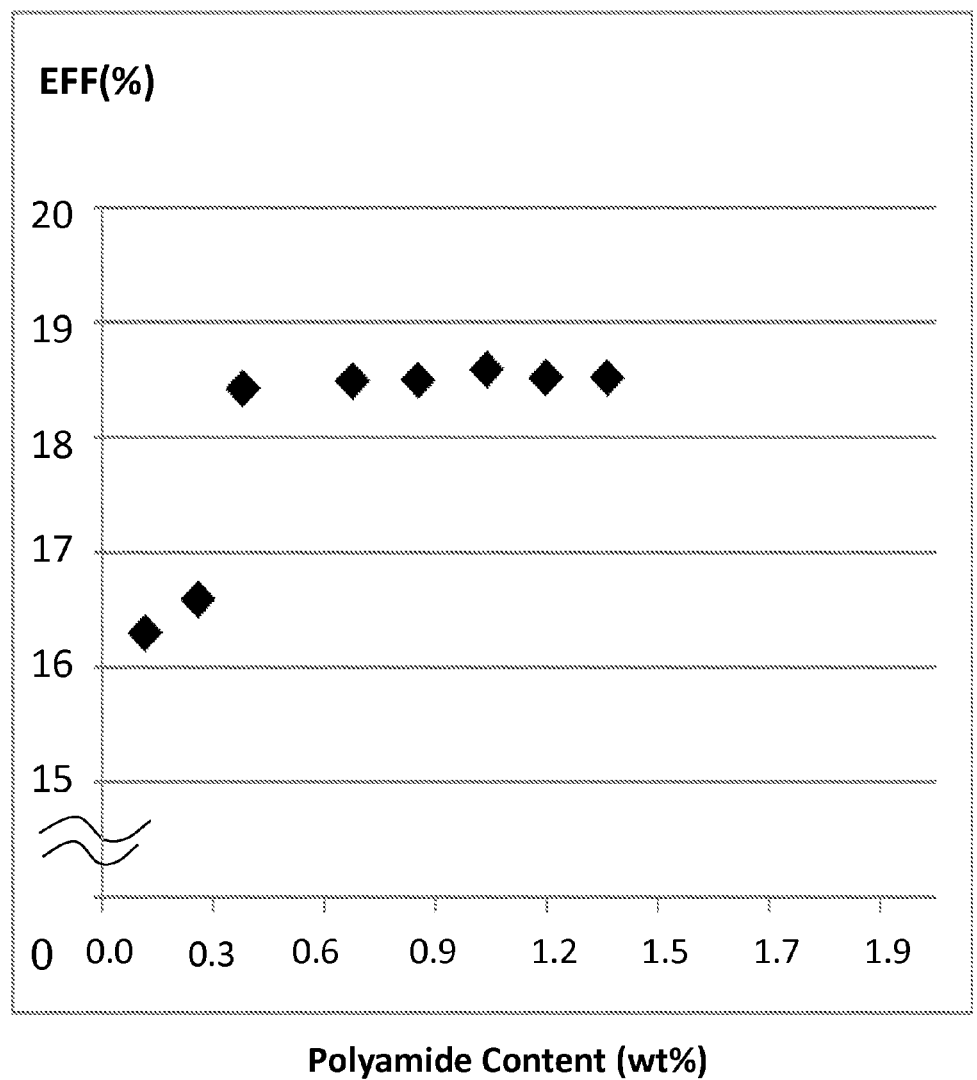
FIG. 3 shows the results of a measurement of EFF (%) in the Examples.

The results of the Examples are follows. With respect to aspect ratio, as shown in Table 1 and FIG. 2, good results were not obtained when the amounts of the fatty acid amide were 0.2 wt % and 0.3 wt % (Comparative Examples 1 and 2). In contrast, good results were obtained in all of the cases where the amounts thereof were 0.4 wt % and larger (Examples 1 to 6). Furthermore, with respect to EFF (%), as shown in Table 1 and FIG. 3, good results were not obtained when the amount of the fatty acid amide was 0.3 wt % and smaller (Comparative Examples 1 and 2). In contrast, quite good results were obtained in the cases where the amounts thereof were 0.4 wt % and larger (Examples 1 to 6). Incidentally, in the Examples, the case where the cell had an EFF (%) of 18% or higher was rated as "good".

TABLE 1

| | | Co. Ex 1 | Co. Ex 2 | Ex 1 | Ex. 2 | Ex. 3 | Ex. 4 | Ex. 5 | Ex. 6 |
|---|---|---|---|---|---|---|---|---|---|
| Paste Composition | Ag Powder | 89 wt % | 89 wt % | 89 wt % | 89 wt % | 89 wt % | 89 wt % | 89 wt % | 89 wt % |
| | Glass frit | 1.6 wt % | 1.6 wt % | 1.6 wt % | 1.6 wt % | 1.6 wt % | 1.6 wt % | 1.6 wt % | 1.6 wt % |
| | Organic medium | 9.2 wt % | 9.1 wt % | 9.0 wt % | 8.7 wt % | 8.5 wt % | 8.3 wt % | 8.2 wt % | 8.1 wt % |
| | Amide compound | 0.2 wt % | 0.3 wt % | 0.4 wt % | 0.7 wt % | 0.9 wt % | 1.1 wt % | 1.2 wt % | 1.4 wt % |
| Property | **Viscosity | 250 Pa·s | 300 Pa·s | 550 Pa·s | 600 Pa·s | 600 Pa·s | 710 Pa·s | 850 Pa·s | 950 Pa·s |
| | Width of the electrode | 89 μm | 89 μm | 56 μm | 48 μm | 46 μm | 39 μm | 41 μm | 40 μm |
| | Hight of the electrode | 11 μm | 10 μm | 25 μm | 19 μm | 22 μm | 20 μm | 21 μm | 27 μm |
| | *Aspect ratio | 0.1 | 0.1 | 0.4 | 0.4 | 0.4 | 0.5 | 0.5 | 0.5 |
| | EFF (%) | 16.2 | 16.6 | 18.3 | 18.5 | 18.5 | 18.6 | 18.5 | 18.5 |

*Aspect ratio is (Width/Height) of the formed electrode.
**Viscosity of the conductive paste composition is a value obtained by measurement at 25° C., 10 rpm using a Brookfield HBT viscometer with a #14 spindle and a utility cup.

We claim:

1. A method of manufacturing a solar electrode comprising steps of:
    (a) stencil printing a conductive paste onto a front side of a semiconductor substrate through a printing mask, the conductive paste comprising:
        (i) 60 wt % to 95 wt % of a conductive powder,
        (ii) 0.1 wt % to 10 wt % of a glass frit,
        (iii) 3 wt % to 30 wt % of an organic medium,
        (iv) 0.4 wt % to 1.7 wt % of an amide compound, based on the total weight of the conductive paste; and
    (b) firing the applied conductive paste to form an electrode wherein the amide compound is a fatty acid diamide represented by the formula: R'—CO—NH—R"—NH—CO—R', wherein R' independently represents an substituted or unsubstituted aliphatic chain of a fatty acid, and R" represents an substituted or unsubstituted alkylene group.

2. The method of claim 1, wherein the glass frit is a lead-tellurium-boron-oxide.

3. The method of claim 1, wherein the width of the electrode is 20 to 60 μm and the height of the electrode is 10 to 35 μm.

4. The method of claim 1, wherein the aspect ratio (height/width) of the electrode is 0.3 to 0.6.

5. The method of claim 1, wherein the peak temperature in the firing step is 600 to 900° C.

6. The method of claim 1, wherein the printing mask is a metal mask.

7. The method of claim 1, wherein the viscosity of the conductive paste is 350 to 1000 Pa·s.

* * * * *